United States Patent
Nishioka et al.

(10) Patent No.: US 7,096,384 B2
(45) Date of Patent: Aug. 22, 2006

(54) FAULT SIMULATOR FOR VERIFYING RELIABILITY OF TEST PATTERN

(75) Inventors: Chika Nishioka, Hyogo (JP); Yoshikazu Akamatsu, Hyogo (JP); Hideyuki Ohtake, Hyogo (JP)

(73) Assignees: Renesas Technology Corp., Tokyo (JP); Mitsubishi Electric System LSI Design Corporation, Itami (JP)

( * ) Notice: Subject to any disclaimer, the term of this patent is extended or adjusted under 35 U.S.C. 154(b) by 575 days.

(21) Appl. No.: 10/367,785

(22) Filed: Feb. 19, 2003

(65) Prior Publication Data

US 2004/0088627 A1    May 6, 2004

(30) Foreign Application Priority Data

Aug. 29, 2002  (JP) .............................. 2002-251506

(51) Int. Cl.
*G06F 11/00* (2006.01)
(52) U.S. Cl. ..................... 714/27; 714/33; 714/741
(58) Field of Classification Search .............. 714/27, 714/741, 33
See application file for complete search history.

(56) References Cited

U.S. PATENT DOCUMENTS

| 6,401,227 B1 * | 6/2002 | Yasue et al. ................. 714/744 |
| 6,490,702 B1 * | 12/2002 | Song et al. .................. 714/726 |
| 6,708,139 B1 * | 3/2004 | Rearick et al. ............. 702/185 |
| 2003/0149916 A1 * | 8/2003 | Ohtake et al. ................ 714/33 |
| 2003/0188246 A1 * | 10/2003 | Rearick et al. ............. 714/738 |
| 2005/0149790 A1 * | 7/2005 | Yoshida et al. ............. 714/724 |

FOREIGN PATENT DOCUMENTS

JP         9-54136        2/1997

* cited by examiner

*Primary Examiner*—Robert Beausoliel
*Assistant Examiner*—Michael Maskulinski
(74) *Attorney, Agent, or Firm*—Buchanan Ingersoll PC

(57) ABSTRACT

A fault simulator includes a circuit identifying section that selects, as fault generation points, circuit components subjected to a simulation from timing simulation results obtained by a static timing simulation of an LSI circuit; a fault value computing section that generates delay faults corresponding to the fault generation points using information about delay time and timing of signal transmission in the timing simulation result; and a fault simulating section that performs, by using a test pattern of the simulation, a logic simulation of a normal circuit of the LSI circuit and that of a faulty circuit where the delay faults are inserted into the fault generation points, and verifies detectability of the delay faults by the test pattern from the compared results of both the logic simulations. The fault simulator can reduce the time of the fault simulation.

2 Claims, 10 Drawing Sheets

FIG.5A
```
                                    13
┌─────────────────────────────┐
│  MERGIN        :5.977ns     │
│  DELAY WIDTH   :5ns         │
│  QUANTITY      :1ns         │
└─────────────────────────────┘
```
FIG.5B
```
                                    14
┌─────────────────────────────┐
│  Input margin       :5.977ns│
│  Input delay width  :5ns    │
│  Input quantity     :1ns    │
└─────────────────────────────┘
```
FIG.6
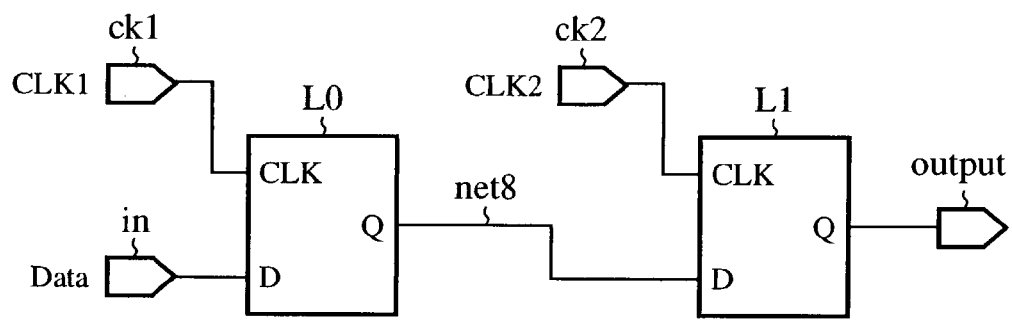
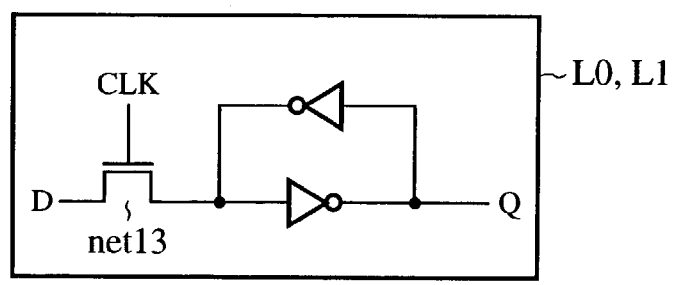

<SETUP SLACK TABLE>

| | slack | data valid | | data required | | setup time | | path type | | from => to | |
|---|---|---|---|---|---|---|---|---|---|---|---|
| 1 | 5.358 | 8.242 | 0.842 | AR2 | 13.600 | 1.000 | BF1 | C-O | | ck2(R) | output(F) |
| | | ① | ② | ③ | ④ | ⑤ | ⑥ | ⑦ | ⑧ | | ⑨ |
| 2 | 5.863 | 7.737 | 0.337 | AR2 | 13.600 | 1.000 | BF1 | C-O | | ck2(R) | output(R) |
| 3 | 5.977 | 8.623 | 1.223 | AR2 | 14.600 | 0.000 | BF1 | D-L | | in(R)L0.net13(R) |
| 4 | 6.028 | 8.572 | 1.172 | AR2 | 14.600 | 0.000 | BF1 | D-L | | in(F)L0.net13(F) |
| 5 | 10.101 | 1.499 | 1.099 | AR1 | 11.600 | 0.000 | BF2 | C-L | | ck1(R)L1.net13(F) |
| 6 | 10.706 | 0.894 | 0.494 | AR1 | 11.600 | 0.000 | BF2 | C-L | | ck1(R)L1.net13(R) |

<HOLD SLACK TABLE>

| | slack | data valid | | data required | | hold time | | path type | | from => to | |
|---|---|---|---|---|---|---|---|---|---|---|---|
| 1 | -0.706 | 0.894 | 0.494 | AR1 | 1.600 | 0.000 | BF2 | C-L | | ck1(R)L1.net13(R) |
| 2 | -0.101 | 1.499 | 1.099 | AR1 | 1.600 | 0.000 | BF2 | C-L | | ck1(R)L1.net13(F) |
| 3 | 3.972 | 8.572 | 1.172 | AR2 | 4.600 | 0.000 | BF1 | D-L | | in(F)L0.net13(F) |
| 4 | 4.023 | 8.623 | 1.223 | AR2 | 4.600 | 0.000 | BF1 | D-L | | in(R)L0.net13(R) |
| 5 | 4.137 | 7.737 | 0.337 | AR2 | 3.600 | 1.000 | BF1 | C-O | | ck2(R) | output(R) |
| 6 | 4.642 | 8.242 | 0.842 | AR2 | 3.600 | 1.000 | BF1 | C-O | | ck2(R) | output(F) |

| ① STATES | ② DELAY FAULT VALUES | ③ FAULT POSITIONS | |
|---|---|---|---|
| N | 21.977 | in | ~15 |
| N | 22.977 | in | |
| N | 23.977 | in | |
| N | 24.977 | in | |
| N | 25.977 | in | |

US 7,096,384 B2

FAULT SIMULATOR FOR VERIFYING RELIABILITY OF TEST PATTERN

BACKGROUND OF THE INVENTION

1. Field of the Invention

The present invention relates to a fault simulator for verifying the reliability of a test pattern used for a delivery test of semiconductor circuits such as LSIs.

2. Description of Related Art

A fault simulator is a quality verification apparatus for verifying the degree to which an input vector (test pattern) for the delivery test can screen faulty LSIs in a preshipment test.

FIG. 9 is a block diagram showing a configuration of a conventional fault simulator. In FIG. 9, the reference numeral 100 designates a fault simulator for carrying out the quality verification of a test pattern. It includes a CPU for executing programs for implementing the functions of components which will be described later. The reference numeral 101 designates a stuck-at 0 or 1 fault simulating section constituting a main component of the fault simulator 100. It simulates as to whether a test pattern 104 can screen the stuck-at 0 or 1 fault among the causes of faults of an LSI. The reference numeral 102 designates a netlist consisting of logical connection information on an LSI circuit supplied to the fault simulator 100. The reference numeral 103 designates a list file of fault generation points. It describes information specifying a circuit to which a fault model is to be inserted. The reference numeral 104 designates a test pattern to be verified. It consists of input information for causing the LSI circuit to perform specified operation for the test.

The reference numeral 105 designates a fault detection report file that describes the results the stuck-at 0 or 1 fault simulating section 101 obtains by verifying the test pattern 104 using the netlist 102 and fault generation point list file 103. The reference numeral 106 designates a fault generator for generating a stuck-at 0 or 1 fault model to be incorporated into the fault generation point. The stuck-at 0 or 1 fault model is a fault model for simulating the stuck-at 0 or 1 fault, one of the causes of faults of the LSI circuit. The stuck-at 0 or 1 fault simulating section 101 and fault generator 106 are implemented by a program executed by a computer functioning as the fault simulator 100.

FIGS. 10A and 10B are schematic diagrams illustrating a stuck-at 0 or 1 fault: FIG. 10A illustrates the causes of the stuck-at 0 or 1 fault; and FIG. 10B illustrates output signals in the stuck-at 0 or 1 fault. As illustrated in FIG. 10A, the stuck-at 0 or 1 fault arises when a part of the LSI circuit comes into contact with a power supply or ground. As an example of a normal circuit, an inverter is described here which has an input signal pattern and an output signal pattern as illustrated in FIG. 10B.

When a contact with the power supply takes place at the input side of the inverter as indicated by the symbol A of FIG. 10A, the output signal is stuck at logic level 0 (L level) as indicated by the symbol B of FIG. 10B, which is a stuck-at 1 fault. In contrast, when the input side is grounded, the output signal is stuck at logic level 1 (H level) as indicated by the symbol B, which is a stuck-at 0 fault.

Next, the operation of the conventional fault simulator will be described.

FIG. 11 is a flowchart illustrating the operation of the fault simulator of FIG. 9. The simulation of the stuck-at 0 or 1 fault will be described with reference to FIG. 11.

First, the fault generator 106 in the fault simulator 100 captures the connection information (circuit information) of the LSI circuit from the netlist 102 (step ST101), and extracts from the circuit information a fault generation point to which a virtual fault is to be assigned (step ST102). Subsequently, the fault generator 106 generates the list file 103 of the fault generation point extracted. Here, the fault generator 106 generates a stuck-at 0 or 1 fault model as a fault model that is incorporated into the fault generation point to cause the virtual fault. The conventional fault simulator 100 carries out the test by inserting the fault to the entire LSI circuit (to all the gates and nodes) by using the stuck-at 0 or 1 fault model.

Next, according to the input information fed from the test pattern 104, the stuck-at 0 or 1 fault simulating section 101 in the fault simulator 100 carries out a logic simulation of the normal circuit that will not bring about any fault (step ST103). The stuck-at 0 or 1 fault simulating section 101 keeps the logic simulation results as the expected values of the normal circuit (step ST104).

Subsequently, the stuck-at 0 or 1 fault simulating section 101 incorporates the stuck-at 0 or 1 fault model the fault generator 106 generates into the fault generation point in the LSI circuit read from the fault generation point list file 103, thereby providing a virtual fault (step ST105). Then, the stuck-at 0 or 1 fault simulating section 101 carries out the logic simulation of the faulty circuit (step ST106), and holds the logic simulation results.

Subsequently, the stuck-at 0 or 1 fault simulating section 101 compares the logic simulation results of the normal circuit held at step ST104 with the logic simulation results of the faulty circuit held at step ST106 (step ST107). If the compared result indicates the difference, it means that the test pattern to be verified can detect the fault. Thus, it can confirm the quality of the test pattern. Subsequently, the stuck-at 0 or 1 fault simulating section 101 supplies the compared result to the fault detection report file 105 to be stored (step ST108).

After the foregoing processing has been completed, according to the contents of the fault generation point list file 103, the stuck-at 0 or 1 fault simulating section 101 makes a decision as to whether any other fault generation point is present in the LSI circuit (step ST109). If any other fault generation point is present, the stuck-at 0 or 1 fault simulating section 101 executes the processing from step ST105 to step ST108 for each fault generation point. Subsequently, when no other fault generation point is present at step ST109, it completes the fault simulation processing. Thus, it makes a decision as to whether the fault simulation of the entire circuit has been completed, and continues the fault simulation if necessary.

Next, the causes of the faults of the LSI circuit will be described.

The causes of the faults of the LSI include besides the stuck-at 0 or 1 fault as illustrated in FIGS. 10A and 10B, a delay fault that causes a malfunction because of abnormal operation timing of a circuit, and other faults such as a bridge fault. In the conventional LSI manufacturing process, most of the faults can be verified using the stuck-at 0 or 1 fault model. However, in the ultrafine process in recent years, the delay fault occurs frequently because of the delay through wiring.

FIG. 12 is a diagram illustrating an example of the delay fault, in which a flip-flop (FF) and a timing chart are shown. The flip-flop has a terminal D supplied with a data signal, a terminal T supplied with a clock signal, and a terminal Q producing an output signal. For the convenience sake, the signals corresponding to the terminals D, T and Q are called signals D, T and Q, respectively. FIG. 12 also shows the fluctuations in the input timing of the data signal D along the time axis because of some reasons, which constitute the fault types 1, 2 and 3.

In the timing chart of FIG. 12, the reference symbols S1 and S2 each designate a comparing point of the expected value; and the symbol + designates a normal delay of +5 time units, ++ designates a normal delay of +10 time units, – designates a normal delay of –5 time units, and – – designates a normal delay of –10 time units.

It is unlikely that a semiconductor circuit such as an LSI includes only a flip-flop circuit. Thus, it is natural to assume that the flip-flop is connected to the next circuit. In this case, the signal causing a problem of the entire circuit is the output signal Q. In the example of FIG. 12, it is assumed that no malfunction takes place when the output signal Q operates as in the normal circuit between the time S1 and S2.

Considering these conditions, the fault types will be described. As for the fault type 1, the data signal D arrives with a delay of 5 time units (time unit in the simulation). In this case, the data signal D rises simultaneously with the clock signal T, and hence the operation of the flip-flop circuit is undetermined. Thus, the output signal Q has a problem such as Q(case 1) or Q(case 2). In other words, although the output signal Q(case 1) makes a correct signal transition as in the normal circuit, the output signal Q(case 2) is stuck to the L level.

In the fault type 2, the data signal D arrives with a delay of 10 time units so that the output signal Q has a problem of being unable to make any transition. Finally, in the fault type 3, although the data signal D arrives 5 time units earlier, the output signal Q makes a correct transition between the time S1 and S2, and the circuit operates normally. Thus, it often occurs that the circuit cannot operate normally because of the fluctuations in the timing of the signal transmission. Therefore a fault simulator that can verify the delay fault is necessary.

With the foregoing configuration, the conventional fault simulator lacks the function of generating a delay fault model for considering the effect of the delay. Thus, it has a problem of being unable to verify the test pattern as to whether it can detect a fault due to the timing fluctuations in the signal transmission.

More specifically, semiconductor circuits such as LSIs fabricated through the ultrafine process of recent years have a lot of faults due to the delay through wiring. Accordingly, it is necessary to check whether the test pattern for the delivery test can detect the fault due to the delay correctly or not. However, the conventional stuck-at 0 or 1 fault model, which cannot take account of the timing fluctuations in the signal transmission, cannot verify the test pattern in terms of the fault due to the delay.

In addition, the conventional fault simulator 100 inserts the fault model to the entire LSI circuit (to all the gates and nodes). As a result, the fault simulation time increases enormously with an increase in the circuit scale of the LSI circuit. This offers a problem of being unable to carry out practical fault simulation. In such a case, it is necessary to reduce the points subjected to the fault simulation in the LSI circuit.

SUMMARY OF THE INVENTION

The present invention is implemented to solve the foregoing problems. It is therefore an object of the present invention to provide a fault simulator capable of simulating the test pattern in terms of the fault due to delay and of shortening the time of the fault simulation by reducing the points to be subjected to the fault simulation in a semiconductor integrated circuit such as an LSI according to the results of a static timing simulation, and by generating delay fault models corresponding to the points.

According to one aspect of the present invention, there is provided a fault simulator that receives simulation result information obtained by a static timing simulation about delay time and timing of signal transmission in a semiconductor integrated circuit, and selects circuit components subjected to the simulation from the simulation result information as fault generation points; that generates delay faults corresponding to the fault generation points using the information about the delay time and timing of the signal transmission in the simulation result information; and that carries out, by using a test pattern to be verified, a logic simulation of a normal circuit of the semiconductor integrated circuit and a logic simulation of a faulty circuit in which the delay faults are inserted into the fault generation points, and verifies detectability of the delay faults by the test pattern from compared results of both the logic simulations. Thus, it offer an advantage of being able to simulate the detectability of the delay fault by the test pattern. In addition, it can reduce the fault simulation time because it uses, as the fault generation points, the circuit components selected from the simulation result information obtained by the static timing simulation.

BRIEF DESCRIPTION OF THE DRAWINGS

FIGS. 5A and 5B are diagrams illustrating a setting method of user-set information;

FIG. 6 is a block diagram showing a circuit configuration whose timing should be considered;

FIG. 7 is a table illustrating an example of the timing simulation results of the latch-latch circuit of FIG. 6;

DETAILED DESCRIPTION OF THE PREFERRED EMBODIMENTS

The invention will now be described with reference to the accompanying drawings.

Embodiment 1

Figure 1:
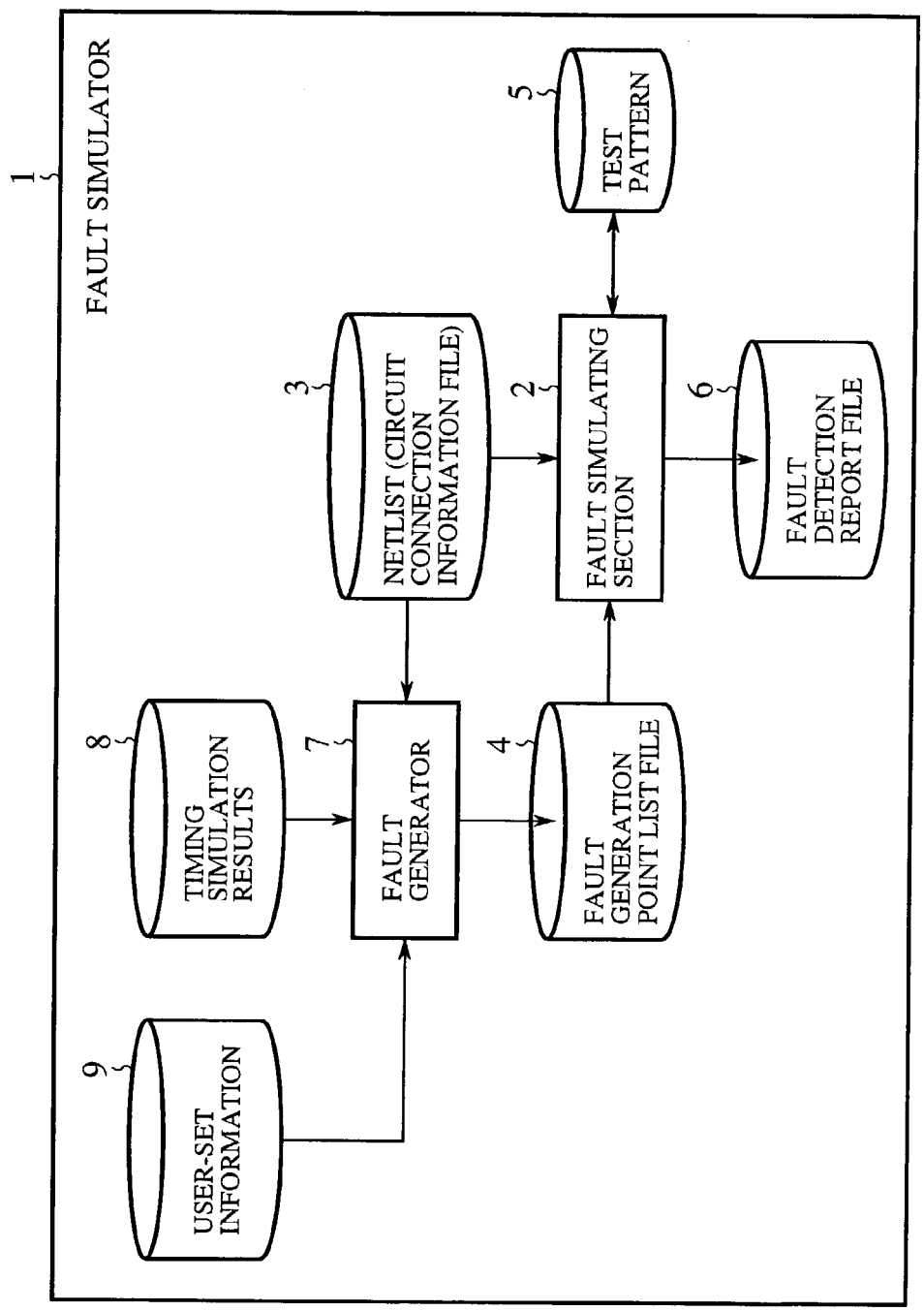
FIG. 1 is a block diagram showing a configuration of an embodiment 1 of the fault simulator in accordance with the present invention.

FIG. 1 is a block diagram showing a configuration of an embodiment 1 of the fault simulator in accordance with the present invention. In FIG. 1, the reference numeral 1 designates a fault simulator of the present embodiment 1. It includes a computer for executing programs for implementing the functions of the components which will be described later. The reference numeral 2 designates a fault simulating section for checking whether a test pattern 5 can simulate a delay fault of an LSI circuit. The reference numeral 3 designates a netlist consisting of logical connection information about the LSI circuit input to the fault simulator 1. The reference numeral 4 designates a list file of fault generation points, which describes information specifying a circuit component to which a fault model is to be inserted. The reference numeral 5 designates a test pattern to be verified. It consists of input information for causing the LSI circuit to perform specified operations for the test.

The reference numeral 6 designates a fault detection report file that describes the results the fault simulating section 2 obtains by verifying the test pattern 5 using the netlist 3, fault generation point list file 4, timing simulation results 8 and user-set information 9. The reference numeral 7 designates a fault generator for extracting a specified circuit to which a delay fault model is to be inserted according to the timing simulation results 8, and for generating a delay fault model corresponding to the specified circuit. Here, the specified circuit refers to a circuit configuration a static timing simulation extracts and describes in the timing simulation results 8.

More specifically, a static timing simulation apparatus (not shown) for generating the timing simulation results 8 identifies circuit components whose signal transmission timing in the LSI must be considered, such as a latch circuit, flip-flop circuit and domino circuit, and carries out the static timing simulation of the circuit components. Then, the fault simulator 1 in accordance with the present invention carries out the simulation effectively by extracting the circuit components to which a delay fault model is to be inserted by utilizing the timing simulation results 8 by the static timing simulation apparatus. The fault simulating section 2 and fault generator 7 are implemented by programs executed by a computer functioning as the fault simulator 1.

The reference numeral 8 designates the timing simulation results of the LSI the static timing simulation apparatus obtains. The timing simulation results 8 describe information specifying the circuit components in the LSI whose signal transmission timing must be considered, and describe the simulation results about the signal transmission timing. As the static timing simulation apparatus, an apparatus using the existing simulation technique is available. The reference numeral 9 designates user-set information that describes parameter values such as a delay width and variation necessary for the delay fault model. The information can also include information specifying the fault generation points.

Figure 2:
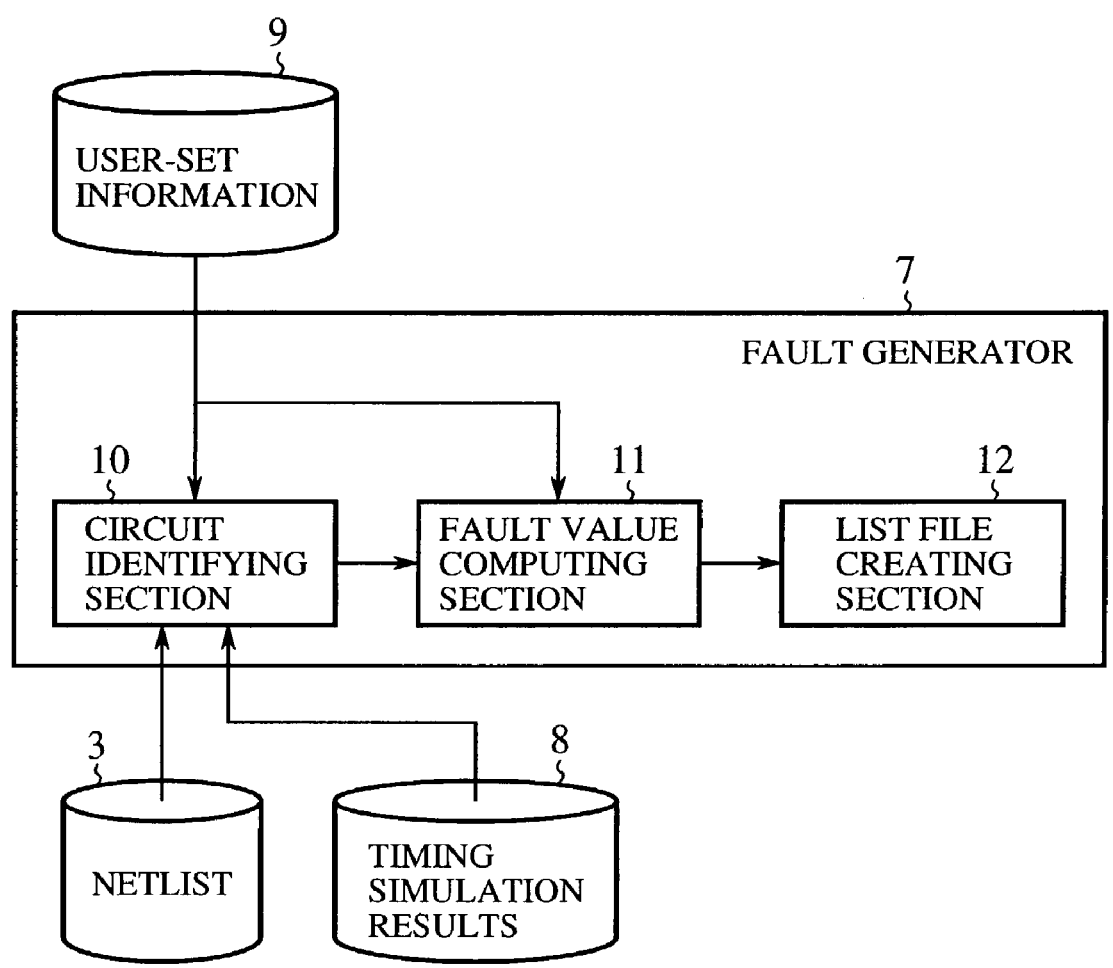
FIG. 2 is a block diagram showing a configuration of the fault generator of FIG. 1.

FIG. 2 is a block diagram showing a configuration of the fault generator 7 of FIG. 1. In FIG. 2, the reference numeral 10 designates a circuit identifying section for extracting a fault generation point to which the delay fault model should be inserted from the LSI circuit specified by the circuit information in the netlist 3. The reference numeral 11 designates a fault value computing section (delay fault generator) for calculating a fault value to be set to the delay fault model in accordance with the timing simulation results 8 and user-set information 9. The reference numeral 12 designates a list file creating section for creating the list file 4 that describes the information on the fault generation points the circuit identifying section 10 extracts and the information specifying the delay fault models to be inserted to these fault generation points. The same components as those of FIG. 1 are designated by the same reference numerals, and the description thereof is omitted here.

Next, the operation of the present embodiment 1 will be described.

Figure 3:
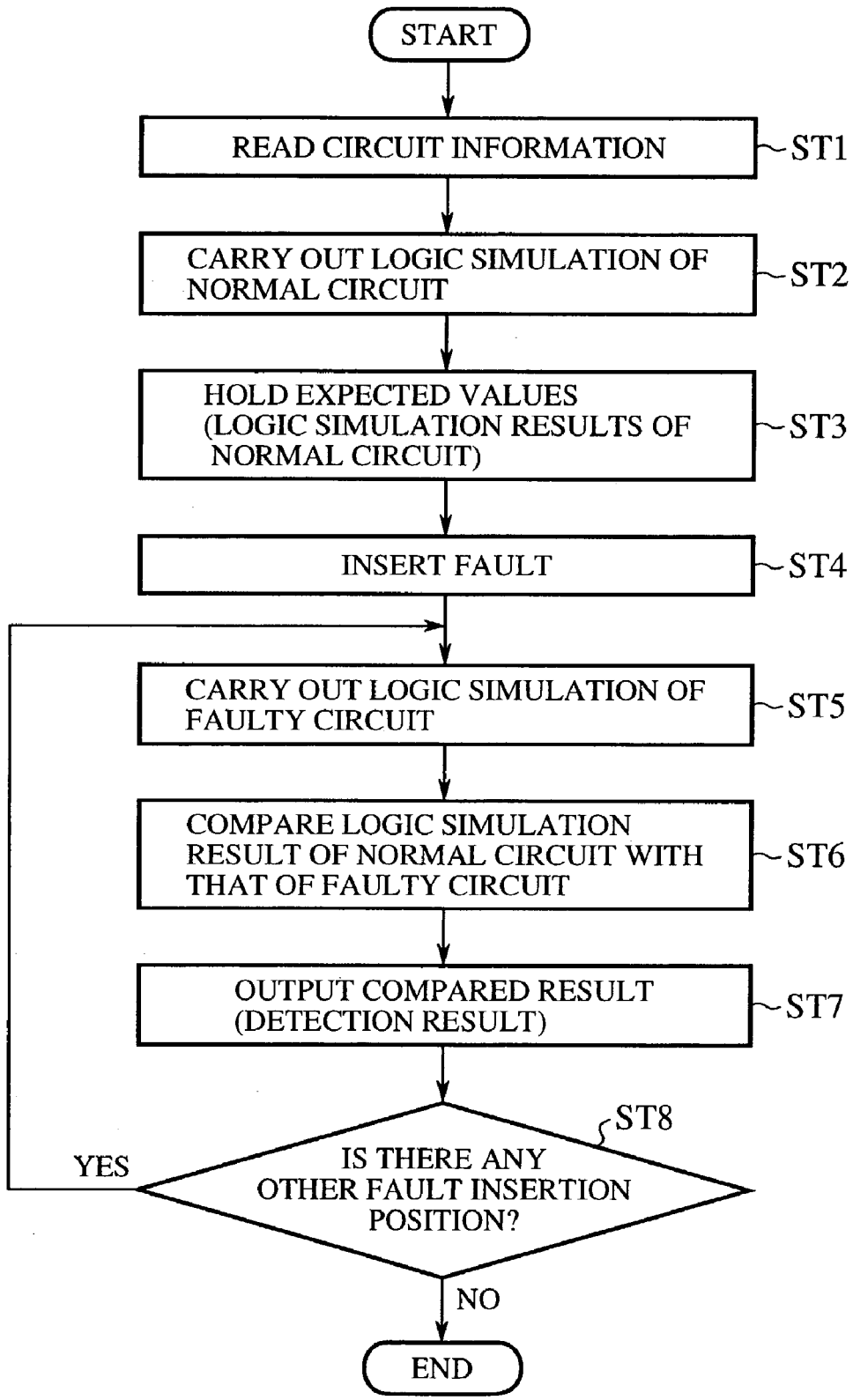
FIG. 3 is a flowchart illustrating the operation of the embodiment 1 of the fault simulator.

FIG. 3 is a flowchart illustrating the operation of the embodiment 1 of the fault simulator. Referring to FIG. 3, the fault simulation processing using the static timing simulation results will be described.

First, the fault simulating section 2 in the fault simulator 1 captures from the netlist 3 the connection information (circuit information) of the LSI circuit whose operation is to be checked by the test pattern 5, and recognizes connection relationships between the circuit cells in the LSI (step ST1). Subsequently, according to the input information from the test pattern 5, the fault simulating section 2 carries out the logic simulation of the normal circuit to which no fault is assigned (step ST2). The fault simulating section 2 stores the logic simulation results as the expected values of the normal circuit (step ST3).

Next, according to the user-set information 9 describing the parameter values necessary for generating the delay fault model, the timing simulation results 8 of the LSI circuit and the connection information about the LSI circuit described in the netlist 3, the fault generator 7 extracts from the LSI circuit the fault generation points to which a virtual fault is to be assigned. Here, the delay fault the fault simulator 1 in accordance with the present invention handles refers to a fault that occurs when the delay of a signal increases or decreases beyond the delay of the normal circuit. More specifically, the fault due to an increase in the delay indicates the case where the LSI circuit cannot operate normally because of delayed signal transmission compared with the normal circuit. In contrast, the fault due to the reduction in the delay indicates the case where the LSI circuit cannot operate normally because of advanced signal transmission compared with the normal circuit.

Considering this, the fault generator 7 increases or decreases the delay of the signal passing through the fault generation points as compared with the delay of the normal circuit, thereby inserting the delay faults. Thus, the fault generator 7 generates delay fault models to be incorporated into the fault generation points to assign the delay faults by using the information described in the timing simulation results 8 and user-set information 9. The fault generator 7 stores in the storage of the fault simulator 1 the information consisting of the collection of the fault generation points and delay fault models to be inserted thereinto, as the fault generation point list file 4. The processing so far corresponds to the fault insertion step at step ST4.

Subsequently, the fault simulating section 2 assigns a virtual fault to a fault generation point in the LSI circuit read from the fault generation point list file 4 by incorporating the delay fault model generated by the fault generator 7 into the fault generation point, and executes the logic simulation of the faulty circuit (step ST5). The fault simulating section 2 stores the logic simulation results.

After completing the logic simulation of the faulty circuit, the fault simulating section 2 compares the logic simulation results of the normal circuit stored at step ST3 with the logic simulation results of the faulty circuit stored at step ST5 (step ST6). If a different value is present at a specified time for comparing the two simulation results, it indicates that the test pattern subjected to the simulation can detect the fault if it is present. This means that the quality of the test pattern is confirmed. In contrast, if all the items of the two simulation results are identical at the specified time, a decision is made that the test pattern subjected to the simulation cannot detect the fault. Subsequently, the fault simulating section 2 supplies the compared results to the fault detection report file 6 to be stored (step ST7).

After completing the series of the foregoing processings, according to the contents of the fault generation point list file 4, the fault simulating section 2 makes a decision as to whether the LSI circuit includes any other fault generation points (step ST8). When any other fault generation points are present, the fault simulating section 2 carries out the processing from step ST5 to step ST7 for each fault generation point. Subsequently, when no other fault generation point is present at the final step ST8, the fault simulation processing is completed. Thus, the fault simulating section 2 makes a decision as to whether the fault simulation of all the circuits has been completed, and continues the fault simulation if necessary.

Next, the fault insertion processing will be described in more detail.

Figure 4:
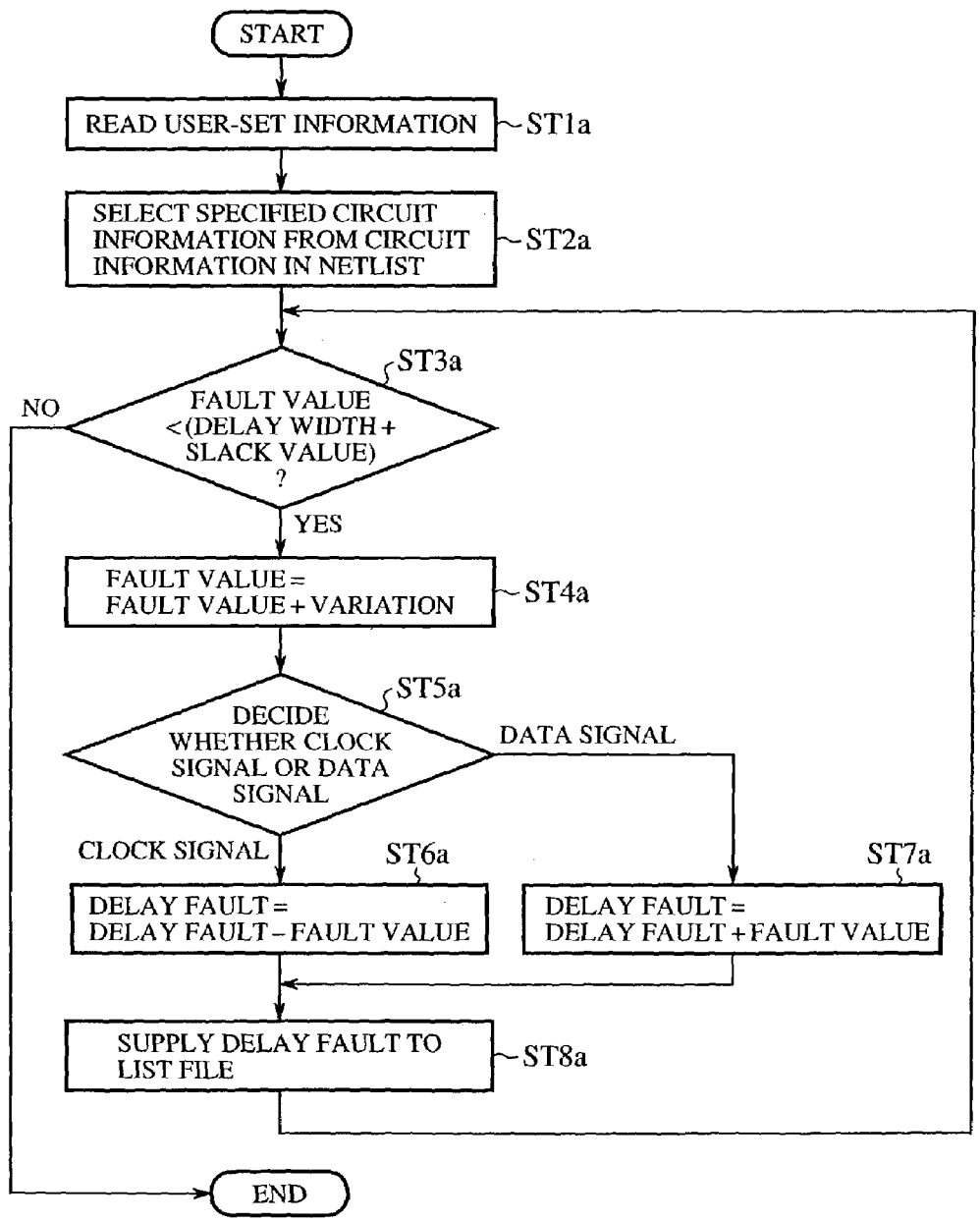
FIG. 4 is a flowchart illustrating the operation of the fault insertion of the embodiment 1 of the fault simulator.

FIG. 4 is a flowchart illustrating the fault insertion operation of the embodiment 1 of the fault simulator. Referring to FIG. 4, generation of concrete delay fault models will be described in conjunction with the extracting processing of the fault generation points.

First, the fault generator 7 reads the user-set information 9 describing the parameter values such as the delay widths and variations, which are necessary for generating the delay fault models (step ST1a). Here, the delay width is a parameter for defining a delay range that is set in terms of the time unit, and is subjected to the simulation. On the other hand, the variation is a parameter for defining the delay amount that is set in terms of the time unit, and defines the delay amount to be altered step by step. The delay width and variation can have different values for setup checking and hold checking.

FIGS. 5A and 5B are diagrams illustrating a setting method of the user-set information: FIG. 5A illustrates a table specification scheme; and FIG. 5B illustrates an interactive scheme. The fault generator 7 reads the user-set information 9 through the setting scheme as illustrated in FIG. 5A or 5B. More specifically, the table specification scheme prepares as the user-set information 9 a table file 13 as illustrated in FIG. 5A, which describes parameter values such as an upper limit value of a timing margin (Margin), a delay width (Delay Width) and a variation (Quantity) to be set to the delay fault model. The contents of the table file 13 are read as arguments when the computer having the functions of the fault simulator 1 executes the program of the fault generator 7.

As for the interactive scheme, on the other hand, when the computer having the functions of the fault simulator 1 executes the program of the fault generator 7, a display unit (not shown) such as a CRT or LCD connected to the computer as standard equipment displays the display information 14 as illustrated in FIG. 5B, which includes the parameter values to be set to the delay fault model as the input items. Using input devices not shown such as a keyboard and a mouse connected to the computer as standard equipment, the user inputs specified values to the input items (Input margin, Input delay Width and Input quantity) in the display information 14. Reading the input value as the user-set information 9, the fault generator 7 generates the delay fault model. Thus, the user-set information 9 is read through the interactive processing in which the user responds to the information provided by the computer having the functions of the fault simulator 1.

After reading the user-set information 9, the fault generator 7 further reads the timing simulation results 8 of the LSI circuit and the connection information about the LSI circuit described in the netlist 3.

FIG. 6 is a block diagram showing a circuit configuration whose timing should be considered. It is a latch-latch circuit consisting of two latch circuits connected in series. For the simplicity of the description, it is assumed that the static timing simulation apparatus extracts the latch-latch circuit as the timing simulation results 8.

At the top of FIG. 6, reference symbols L0 and L1 designate latch circuits having their clock input pins CLK supplied with the clock signals CLK1 and CLK2, respectively. The output signal of the latch circuit L0 is supplied to the data input pin D of the latch circuit L1 via a path net8. The latch circuit L0 receives the data signal D from the data input pin D in response to the clock signal CLK1 supplied to the clock input pin CLK, and outputs the data signal from the data output pin Q.

The latch circuit L1 receives the data signal output from the latch circuit L0 at the data input pin D in response to the clock signal CLK2 supplied to the clock input pin CLK, and outputs the data signal from the data output pin Q. The clock signals CLK1 and CLK2 are supplied to external clock pins ck1 and ck2, respectively. The data signal is supplied to an external data input pin in.

At the bottom of FIG. 6, a circuit configuration of the latch circuit L0 or L1 is shown. It includes two inverters connected in antiparallel, and a path-transistor having its gate supplied with the clock signal CLK1 or CLK2. The path-transistor is denoted as a latch node L0.net13 or L1.net13.

FIG. 7 is a table illustrating an example of the timing simulation results 8 about the latch-latch circuit of FIG. 6 obtained by the static timing simulation apparatus. The timing simulation results 8 describe setup checking results and hold checking results about the positions the static timing simulation apparatus extracts from the circuit configuration in the LSI as the paths where the timing simulation is to be carried out.

For the simplicity of explanation, only the following positions are mentioned as the positions where the timing simulation is to be carried out. A first path corresponds to a path type from clock to output (C-O), that is, "from the input pin ck2 of the clock signal CLK2 to the output terminal Q of the latch circuit L1". A second path corresponds to a path type from data to latch node (D-L), that is, "from the input pin in of the data signal to the latch node L0.net13". A third node corresponds to a path type from clock to latch node (C-L), that is, "from the input pin ck1 of the clock signal CLK1 to the latch node L1.net13".

The first to sixth rows of the setup slack table represent the setup checking results of the static timing simulation apparatus about the paths to be subjected to the timing simulation. The setup checking results correspond to the timing simulation results about the setup, during which the values of the data signals must be secured and held on the paths before the input of the clock signal for the individual items of the columns ① to ⑨ in the table.

Here, the column ① represents slack values, and ② represents absolute delay times taken for the data signals to arrive, which are calculated with respect to time 0 ns. The column ③ represents relative delay times taken for the data signals to arrive, which are calculated with respect to the reference clock. The column ④ represents clock information used as a reference for calculating the relative delay times of the column ③. The symbols AR1 and AR2 in the column ④ indicate that the relative delay times of the column ③ are calculated in terms of time after the rising edge (After Rise: AR) of the reference clock 1 or reference clock 2 the static timing simulation apparatus sets. The column ⑤ represents absolute required time from the time 0 ns, during which the data signal values must be maintained.

The column ⑥ represents relative required time from the reference clock, during which the data signal values must be maintained. The column ⑦ represents clock information referred to when the relative delay time of the column ⑥ is calculated. The symbols BF1 and BF2 in the column ⑦ indicate that the relative delay time of the column ⑥ is calculated in terms of time before the falling edge (Before Fall: BF) of the reference clock 1 or reference clock 2 the static timing simulation apparatus sets. The column ⑧ represents path types, and ⑨ represents the paths to be subjected to the timing simulation.

The first to sixth rows in the hold slack table of FIG. 7 represent the hold checking results of the static timing simulation apparatus about the paths to be subjected to the timing simulation. The hold checking results correspond to the timing simulation results about the hold, during which the data signals must be held on the paths after the clock signal is supplied for the individual items of the columns ① to ⑨ in the table.

The slack value represents a margin up to the time when the timing requirement specified in the setup or hold is satisfied or unsatisfied. The positive slack value represents that the path meets the predetermined timing requirement of the setup or hold. In contrast, the negative slack value represents that the path does not meet the predetermined timing requirement of the setup or hold. In FIG. 7, the paths in the first and second rows of the hold slack table take a negative slack value, which means that they have a timing error.

The static timing simulation apparatus calculates the slack values of the setup and hold by the following expressions (1) and (2).

setup slack value=absolute required time during which data signal value must be held−absolute delay time taken for data signal to arrive (1)

hold slack value=absolute delay time taken for data signal to arrive−absolute required time during which data signal value must be held (2)

As described above, the timing simulation results 8 describes the circuit components the static timing simulation apparatus extracts in order to consider their signal transmission timing, and the information about the delay and timing in the signal transmission through the circuit components (called "delay information" from now on). Thus, the circuit identifying section 10 in the fault generator 7 of the present embodiment 1 identifies all the paths (circuit components) of the circuits (specified circuits) described in the timing simulation results 8 as items to be subjected to the simulation, and extracts the circuit information from the connection information about the LSI circuit described in the netlist 3 (step ST2a).

After selecting the paths to which the delay fault models are to be inserted, the fault generator 7 generates the delay fault model corresponding to each path. This will be described in more detail by way of example of the latch-latch circuit shown in FIG. 6 and the timing simulation results 8 as shown in FIG. 7.

First, the delay fault generation of the setup will be described. When extracting a path and its delay information about a specified circuit at step ST2a, the circuit identifying section 10 supplies the information to the fault value computing section 11. Let us assume here that the circuit information and delay information on the third path of the setup slack table of FIG. 7 is supplied to the fault value computing section 11.

The delay information (setup checking results) in the third path of the setup slack table in FIG. 7 indicates that the rising edge of the data signal supplied to the data input pin in reaches the latch node L0.net13 at the time 8.623 ns, and that the falling edge of the clock signal CLK1 appears at the time 14.6 ns.

In this case, the latch circuit L0 latches the data signal at the time when the edge of the clock signal CLK1 rises. Accordingly, the data signal must arrive at the data input pin D of the latch circuit L0 before the time 14.6 ns when the edge of the clock signal CLK1 falls, and its value must be held until that time. Thus, the time 14.6 ns when the edge of the clock signal CLK1 falls corresponds to the absolute required time during which the value of the data signal must be held at the data input pin D of the latch circuit L0.

Therefore according to the foregoing expression (1), the slack value 5.977 ns can be obtained by subtracting the absolute delay time 8.623 ns required for the data signal to arrive from the absolute required time 14.6 ns during which the value of the data signal must be held. As a result, the slack value is positive, which indicates that the path satisfies the timing requirement of the setup.

The foregoing setup checking result shows that the path operates normally in the current condition. However, the delay fault is considered to take place when "the clock signal CLK1 arrives 5.977 ns or more earlier" or when "the data signal arrives 5.977 ns or more later".

Obtaining the slack value of the specified circuit by receiving the timing simulation results 8, the fault value computing section 11 calculates the fault value described below by using the slack value as a reference, and computes the delay fault value of the setup according to the following expressions (3) and (4).

delay fault value assigned to clock signal=actual delay value−fault value (3)

delay fault value assigned to data signal=actual delay value+fault value (4)

Here, the actual delay value refers to the delay value of the signal transmission the static timing simulation apparatus calculates for the fault generation point in the logic simulation. The fault value refers to a delay value generated from the slack value. When the fault value is set at a value greater than the slack value, a delay fault takes place.

The processing will be described in more detail. First, the fault value computing section 11 reads the delay width at the fault generation point from the user-set information 9, and compares the value equal to the delay width plus the slack value with the fault value at the fault generation point (step ST3a). If the fault value is greater than the "value equal to the delay width plus the slack value", the fault value computing section 11 completes the processing. This is because although the fault value is to be set by adding to the slack value the variation within the range of the delay width, the fault value has already exceeded the value equal to the slack value plus the delay width.

On the other hand, when "the value equal to the delay width plus the slack value" is greater than the fault value, the fault value computing section 11 sets a new fault value by adding the variation to the fault value (step ST4a). Incidentally, when executing the series of the processing from step ST3a to step ST8a for the first time, the initial values of the fault value and variation are set at 0 ns. When the series of the processing is carried out after that, the initial value of the fault value is set at the slack value, and the variation is set at the value in the user-set information 9.

Subsequently, according to the timing simulation results 8, the fault value computing section 11 makes a decision as to whether the signal with which the delay fault is to be generated is the clock signal or the data signal (step ST5a). When it is the clock signal, the fault value computing section 11 calculates the delay fault value to be assigned to the clock signal according to the foregoing expression (3) (step ST6a) In contrast, when it is the data signal, the fault value computing section 11 calculates the delay fault value to be assigned to the data signal according to the foregoing expression (4) (step ST7a).

After calculating the delay fault value to be assigned to the clock signal or data signal, the fault value computing section 11 supplies the list file creating section 12 with the delay fault value and information about the fault generation point to which the delay fault value is to be assigned. Using the information supplied from the fault value computing section 11, the list file creating section 12 creates the information that designates the fault generation point and the delay fault model to be inserted to the fault generation point to which the delay fault value is assigned, and supplies it to the fault generation point list file 4 to be stored (step ST8a).

Subsequently, the fault value computing section 11 iterates the processing from step ST3a to step ST8a until the fault value exceeds "the value equal to the delay width plus the slack value". Thus, using the slack values calculated according to the foregoing expressions (1) and (2) as the reference, the fault value computing section 11 generates the fault value at the fault generation point by increasing the slack value step by step by adding the variation within the range of the delay width. Then, the delay fault values calculated by using the fault values according to the foregoing expressions (3) and (4) are stored in the fault generation point list file 4 in connection with the corresponding fault generation points.

In addition, executing the processing from step ST3a to step ST8a for the individual fault generation points, the fault value computing section 11 obtains all the paths (fault generation points) and their delay fault models of all the circuits described in the timing simulation results 8. In conjunction with this, the list file creating section 12 sequentially collects as the fault generation point list file 4 the information items about all the fault generation points and their delay fault models the fault value computing section 11 obtains.

Next, the delay fault generation of the hold will be described.

Assume, for example, that the circuit identifying section 10 extracts from the timing simulation results 8 the circuit information and its delay information about the fourth path in the hold slack table of FIG. 7 at step ST2a as the specified circuit information about the hold, and supplies them to the fault value computing section 11.

The delay information (hold checking results) in the fourth path of the hold slack table in FIG. 7 indicates that the rising edge of the data signal supplied to the data input pin in reaches the latch node L0.net13 at the time 8.623 ns, and that the falling edge of the clock signal CLK1 appears at the time 4.6 ns.

In this case, the latch circuit L0 latches the data signal at the time when the edge of the clock signal CLK1 falls. Accordingly, the value of the data signal at the data input pin D must be held from the time 4.6 ns when the edge of the clock signal CLK1 falls and the data signal is latched by the latch circuit L0 to the time 8.623 ns. Thus, the time 4.6 ns when the edge of the clock signal CLK1 falls corresponds to the absolute required time during which the value of the data signal must be held at the data input pin D of the latch circuit L0.

Therefore according to the foregoing expression (2), the slack value 4.023 ns can be obtained by subtracting the absolute required time 4.6 ns, during which the value of the data must be held, from the absolute delay time 8.623 ns required for the data signal to arrive. As a result, the slack value is positive, which indicates that the path satisfies the timing requirement of the hold.

The foregoing hold checking result shows that the path operates normally in the current condition. However, the delay fault is considered to take place when "the clock signal CLK1 delays 4.023 ns or more from the actual state" or when "the data signal advances 4.023 ns or more from the actual state".

In view of this, after obtaining the slack value of the specified circuit by receiving the timing simulation results 8, the fault value computing section 11 calculates the fault values described below by using the slack value as a reference, and computes the delay fault values of the hold according to the following expressions (5) and (6).

delay fault value assigned to clock signal=actual delay value+fault value (5)

delay fault value assigned to data signal=actual delay value−fault value (6)

Since the subsequent operation is the same as the delay fault generation processing in the setup described above, the description thereof is omitted here.

The processing will be described in more detail by way of example of the third path in the setup slack table in FIG. 7. First, it is assumed as the conditions of executing the delay fault generation that the slack value is 5.977 ns, the delay width of the path is 5 ns, and the variation at the setup checking is 1 ns.

In this case, the individual fault values calculated by the fault value computing section 11 increase at every interval of 1 ns of the variation within the range of the delay width of 5 ns. Thus, it calculates the fault values such as fault value (slack value) 5.977 ns+variation 1 ns=6.977 ns, fault value 6.977 ns+variation 1 ns=7.977 ns, and so on up to 5 ns. As a result, it obtains five fault values, 6.977 ns, 7.977 ns, 8.977 ns, 9.977 ns and 10.977 ns.

Next, consider a case where the actual self-delay of the path is 15 ns in the foregoing execution conditions. Here, the actual self-delay of the path corresponds to the delay of the output signal with respect to the input signal to the logic gate in the logic simulation by the static timing simulation apparatus. In this case, the fault value computing section 11 calculates the individual delay fault values to be assigned to the data signal as follows by carrying out the calculation according to the foregoing expression (4) using the self-delay value and the individual fault values.

15 ns+6.977 ns=21.977 ns 15 ns+7.977 ns=22.977 ns 15 ns+8.977 ns=23.977 ns 15 ns+9.977 ns=24.977 ns 15 ns+10.977 ns=25.977 ns

Incidentally, if it is not necessary to consider the width or variation of the fault, the delay width and the variation can be set at the same value. For example, to use only the fault value equal to "the value greater than the slack value 5.977 ns by 1 ns", it is enough to set both the delay width and variation at 1 ns, in which case only 6.977 ns is obtained as the fault value.

Figures 8, 9:
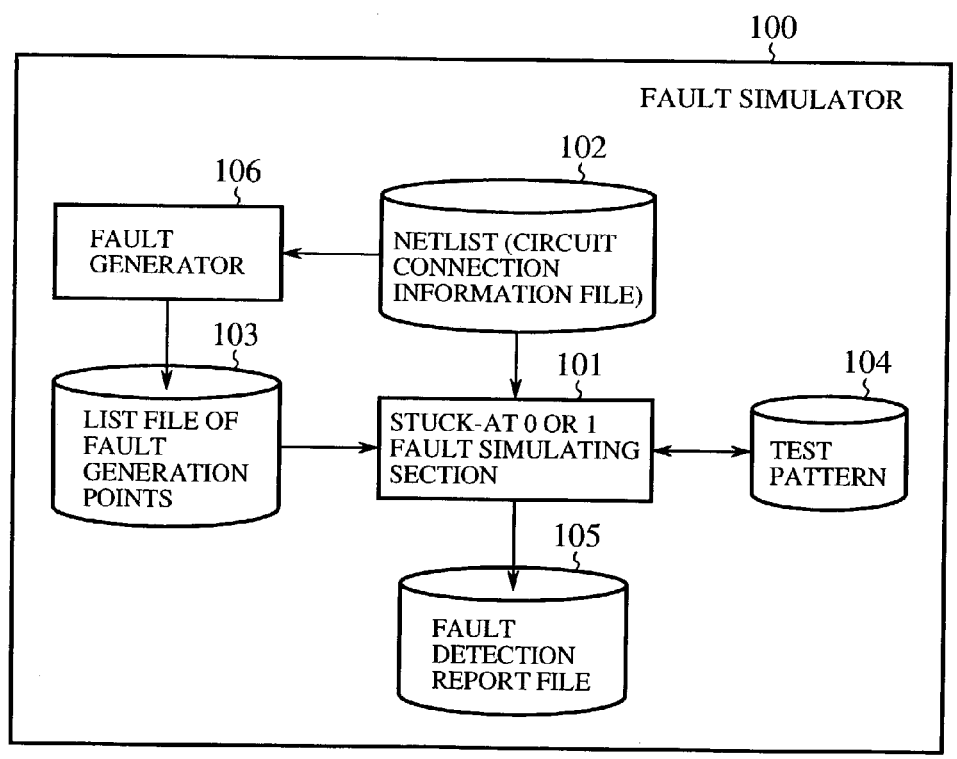
FIG. 8 is a table illustrating a fault position list file the fault simulator of the embodiment 1 generates.
FIG. 9 is a block diagram showing a configuration of a conventional fault simulator.
Figure 10B:
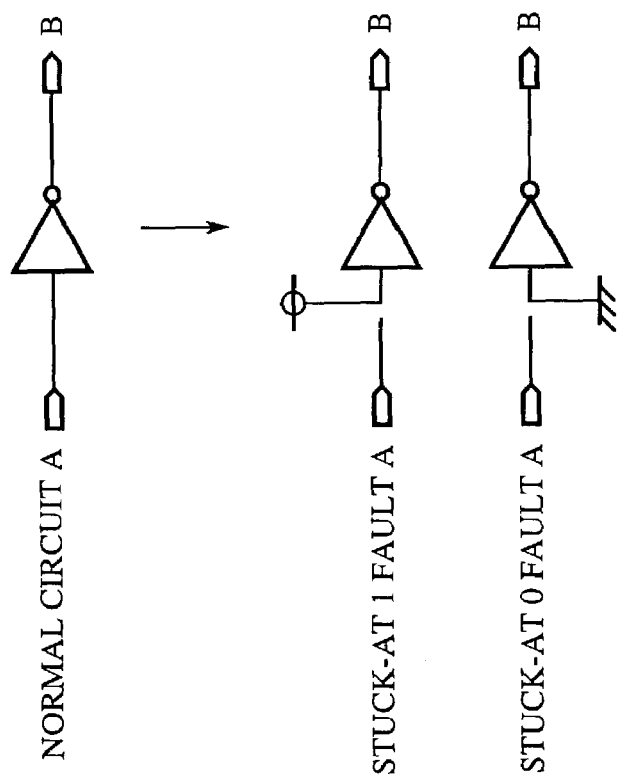
FIGS. 10A and 10B are diagrams illustrating a stuck-at 0 or 1 fault.
Figure 10A:
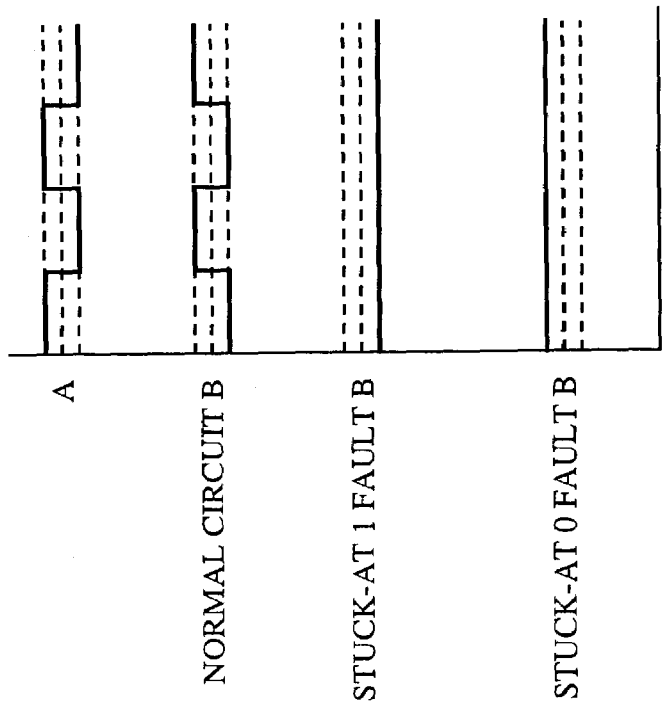
Figure 11:
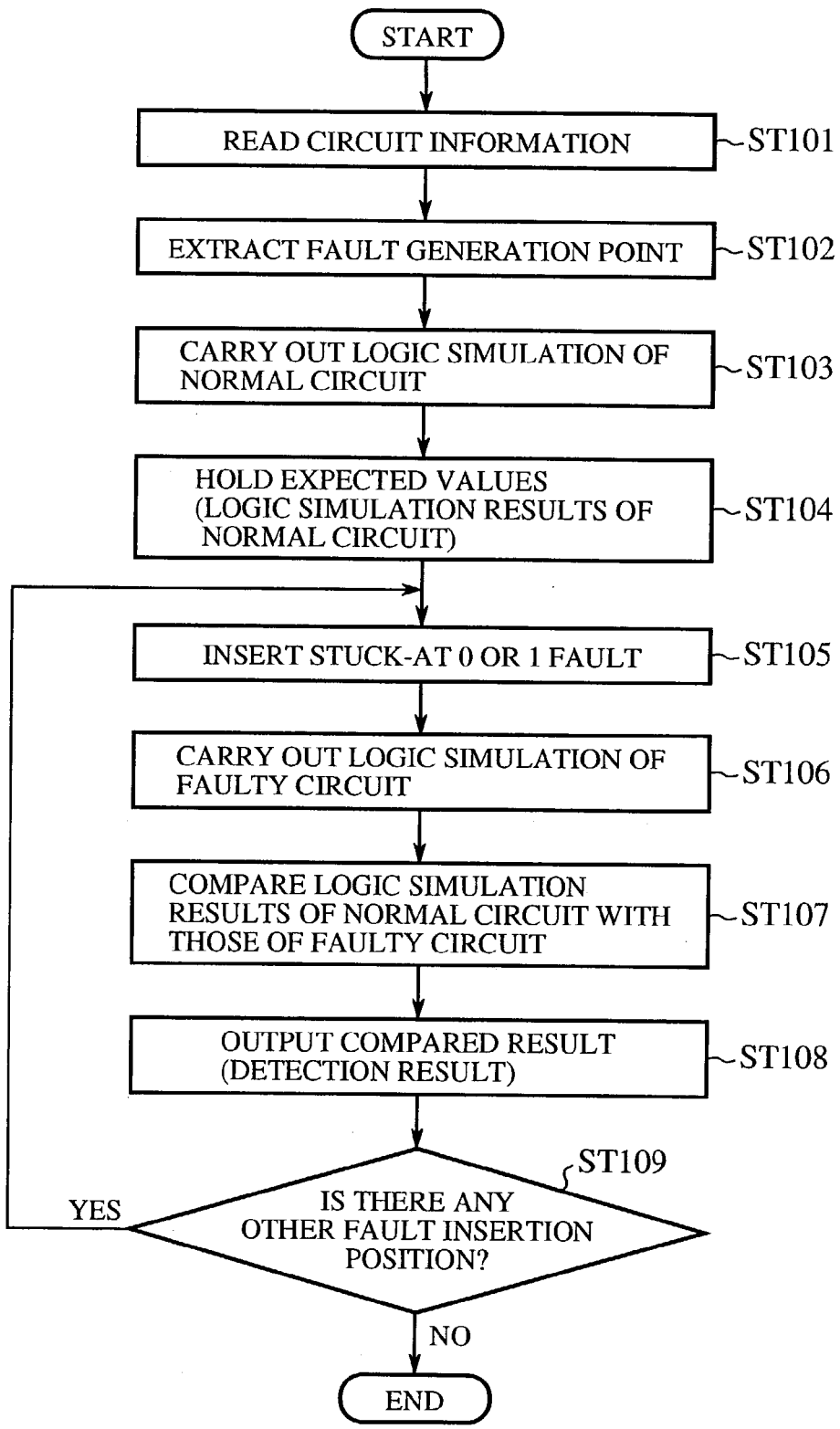
FIG. 11 is a flowchart illustrating the operation of the conventional fault simulator of FIG. 9.
Figure 12:
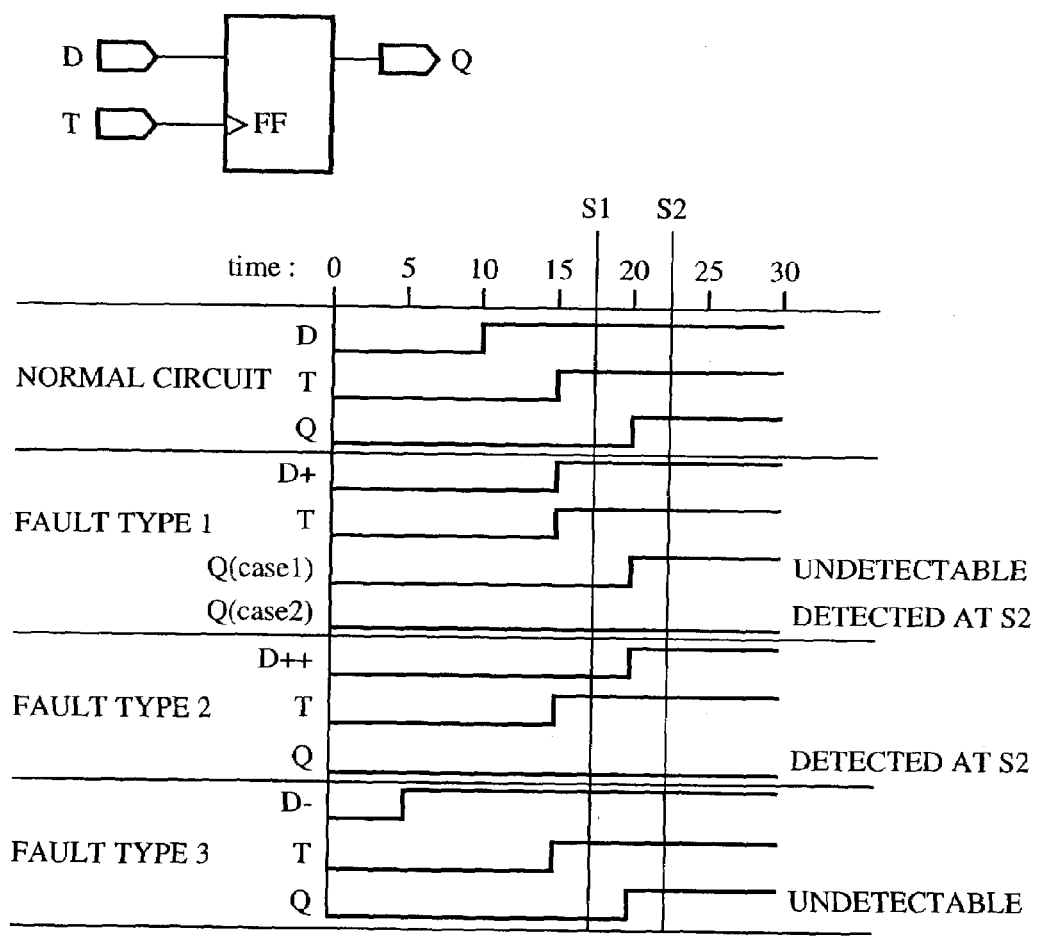
FIG. 12 is a diagram showing an example of a delay fault.

FIG. 8 is a table showing the fault generation point list file the embodiment 1 of the fault simulator generates. In FIG. 8, the reference numeral 15 designates a table file of the fault generation point list file the fault generator 7 generates. It represents the list of the fault generation point of the third path in the setup slack table of FIG. 7. The column ① indicates the current state of the fault simulation, in which a symbol D is set when the simulation by the test pattern 5 is possible, and N is set when the simulation has not yet been carried out. The column ② represents delay fault values the fault generator 7 calculates, which are set as the delay values at the fault positions indicated in the column ③ in the logic simulation by the test pattern 5. The column ③ shows the fault positions the fault generator 7 selects from the LSI circuit, which correspond to the fault generation points to which the delay faults are to be inserted. In the column ③, "in" indicates the data input pin in connected to the latch circuit L0 as shown in FIG. 6, which means that the delay fault is inserted before the data input pin in.

Accepting the table file 15 of the fault generation point list file as shown in FIG. 8, the fault simulating section 2 carries out the logic simulation that provides the fault positions of the column ③ with the delay fault values of the column ②. The logic simulation results are compared with the logic simulation results of the normal circuit at the foregoing step ST6 to make a decision by the compared results as to whether the test pattern subjected to the simulation can detect the fault.

As described above, the present embodiment 1 includes the circuit identifying section 10, the fault value computing section 11 and the fault simulating section 2, wherein the circuit identifying section 10 receives the timing simulation results 8 obtained by the static timing simulation of the delay time and timing of the signal transmission in the LSI circuit, and extracts from the timing simulation results 8 the circuit components subjected to the simulation as the fault generation points; the fault value computing section 11 generates the delay faults corresponding to the individual fault generation points using information about the delay time and timing of the signal transmission in the timing simulation results 8; and the fault simulating section 2, using the test pattern 5 to be verified, carries out the logic simulation of the normal circuit of the LSI circuit and that of the faulty circuit whose individual fault generation points are inserted by the delay faults, and simulates the detectability of the delay faults by the test pattern 5 from the compared results of both the logic simulations. Thus, the present embodiment 1 can simulate the detectability of the faults due to the delay by the test pattern 5. In addition, it can reduce the time required for the fault simulation because it uses, as the fault generation points, only the paths of the specified circuit extracted by the static timing simulation apparatus as the timing simulation results 8.

Embodiment 2

Although the foregoing embodiment 1 employs all the paths described in the timing simulation results 8 obtained by the static timing simulation apparatus as the fault generation points, this is not essential. For example, the present embodiment 2 selects from the timing simulation results 8 the positions at which the timing error occurs, and the positions at which the timing margin concerning the timing requirement is small, as the fault generation points.

Although the present embodiment 2 of the fault simulator has basically the same configuration as the foregoing embodiment 1, the selecting processing of the fault generation points by the fault generator 7 differs. Thus, only the different portion from the foregoing embodiment 1 will be described below.

The present embodiment 2 of the fault simulator has the same configuration as that of the foregoing embodiment 1 as shown in FIGS. 1 and 2. The selection processing of the fault generation points, which differs from that of the foregoing embodiment 1, will be described with reference to FIG. 4. The present embodiment 2 also assumes that the fault generator 7 reads the timing simulation results 8 as shown in FIG. 7.

In the first and second paths in the hold slack table of FIG. 7, the slack values of the column ① are both negative, which means that these paths have timing errors. For example, in the first path in the hold slack table of FIG. 7, the edge of the clock signal CLK2 (that is, the latch time of the latch circuit L1) is 1.6 ns. Accordingly, the value of the data signal must be held until that time at the data input pin D. As for the path, however, the data signal arrives at the time 0.894 ns before the edge of the clock signal CLK2 falls, so that the value of the data signal has already changed.

In addition, when the slack value is small though it is positive, and hence considered to have only a small timing margin concerning the specified conditions, it can cause the timing error at a high probability in the actual LSI. In view of this, the present embodiment 2 selects as the fault generation points the positions having a timing error (where the slack value is negative) in the timing simulation results 8, and the positions with a small timing margin concerning the specified conditions (where the slack value is smaller than a predetermined threshold value).

First, the fault generator 7 reads the user-set information 9 that describes the parameter values necessary for generating the delay fault model as in the foregoing embodiment 1 (step ST1a). In this case, the margin lower limit value is set in addition to the delay width and variation mentioned in the foregoing embodiment 1. The margin lower limit value is a threshold value of the slack value (whose unit is time unit) for making a decision as to whether a circuit described in timing simulation results 8 is a path to be subjected to the simulation or not. In other words, the paths with slack values equal to or less than the margin lower limit value (including the positions with a negative slack value) are selected as the points to be subjected to the simulation (fault generation points). The fault simulator 1 reads the user-set information 9 according to the table scheme or interactive scheme as shown in FIGS. 5A and 5B as in the foregoing embodiment 1.

Subsequently, the fault generator 7 further reads the timing simulation results 8 of the LSI circuit, and the connection information about the LSI circuit described in the netlist 3. Subsequently, the circuit identifying section 10 in the fault generator 7 selects, from the connection information about the LSI circuit described in the netlist 3, the circuit information about the paths which have the slack values equal to or less than the margin lower limit value (including those having a negative slack value) among all the paths of the specified circuits described in the timing simulation results 8 (step ST2a). Thus, the circuit identifying section 10 identifies the paths having the slack values equal to less than the margin lower limit value (including the paths with the negative slack values) among the paths described in the timing simulation results 8 as the fault generation points, and the fault value computing section 11 generates the delay faults only of these fault generation points.

For example, when the margin lower limit value is set at 4.0 ns, the circuit identifying section 10 selects the first, second and third paths which have the slack values equal to or less than 4.0 ns (including the paths with the negative slack values) among the paths described in the hold slack table of FIG. 7, as the fault generation points. In this case, since all the paths described in the setup slack table of FIG. 7 have the slack value greater than 4.0 ns, they are excepted from the simulation.

Incidentally, since the processing following step ST2*a* is the same as that of the foregoing embodiment 1, the description thereof is omitted here.

As described above, the present embodiment 2 is configured such that the circuit identifying section 10 selects, from among the circuit components subjected to the simulation in the timing simulation results 8, the circuit components having the timing margin which is associated with the timing requirement for the signal transmission, is set in advance about the LSI circuit, and does not reach the margin lower limit value, as the fault generation points. Thus, the present embodiment 2 can make the time taken by the fault simulation shorter than that of the foregoing embodiment 1 because the number of the fault generation points selected from the timing simulation results 8, which is obtained by the static timing simulation apparatus, is further reduced.

Embodiment 3

The present embodiment 3 selects the fault generation points from among the circuits described in the timing simulation results obtained by the static timing simulation apparatus according to the designation by the user.

Although the configuration of the present embodiment 3 of the fault simulator is basically the same as that of the foregoing embodiment 1, it differs in the selection processing of the fault generation points by the fault generator 7. The following describes only portions different from the foregoing embodiment 1.

The present embodiment 3 of the fault simulator has the same configuration as that of the foregoing embodiment 1 as shown in FIGS. 1 and 2. The selection processing of the fault generation points, which differs from that of the foregoing embodiment 1, will be described with reference to FIG. 4.

First, the fault generator 7 reads the user-set information 9 that describes the parameter values necessary for generating the delay fault model as in the foregoing embodiment 1 (step ST1*a*). In this case, the information specifying the positions (fault generation points) the user designates as the points to be subjected to the simulation is set in addition to the delay width and variation mentioned in the foregoing embodiment 1. For example, the instance name and net name the user specifies to be subjected to the simulation are set. The fault simulator 1 reads the user-set information 9 according to the table scheme or interactive scheme as shown in FIGS. 5A and 5B as in the foregoing embodiment 1.

Subsequently, the fault generator 7 further reads the timing simulation results 8 of the LSI circuit, and the connection information about the LSI circuit described in the netlist 3. Subsequently, the circuit identifying section 10 in the fault generator 7 selects, from the connection information about the LSI circuit described in the netlist 3, the circuit information about the paths the user specifies among all the paths of the specified circuits described in the timing simulation results 8 (step ST2*a*). Thus, the circuit identifying section 10 identifies the positions the user designates from the specified circuits described in the timing simulation results 8 as the fault generation points, and the fault value computing section 11 generates the delay faults of only the fault generation points.

It is also possible to generate a list file that collects the positions the user wishes to be subjected to the simulation as the user-set information 9, and to cause the circuit identifying section 10 to identify the list file.

Incidentally, the processing following step ST2*a* is the same as that of the foregoing embodiment 1, the description thereof is omitted here.

As described above, the present embodiment 3 is configured such that the circuit identifying section 10 selects the circuit components the user designates in advance as the fault generation points from among the circuit components to be subjected to the simulation in the timing simulation results 8. Thus, the present embodiment 3 can further reduce the time taken by the fault simulation because the individual users specify the positions to be subjected to the delay simulation, and hence the positions not necessary to be subjected to the simulation are not set as the fault generation points.

What is claimed is:

1. A fault simulator comprising:
a fault position selection section that receives simulation result information obtained by a static timing simulation about delay time and timing of signal transmission in a semiconductor integrated circuit, and selects circuit components subjected to the simulation from the simulation result information as fault generation points;
a delay fault generator for generating delay faults corresponding to the fault generation points using the information about the delay time and timing of the signal transmission in the simulation result information; and
a fault simulating section that carries out, by using a test pattern to be verified, a logic simulation of a normal circuit of the semiconductor integrated circuit and a logic simulation of a faulty circuit in which the delay faults are inserted into the fault generation points, and verifies detectability of the delay faults by the test pattern from compared results of both the logic simulations,
wherein said fault position selection section selects, as the fault generation points, the circuit components with temporal margin less than a predetermined threshold value, the temporal margin being associated with timing conditions concerning the signal transmission, which are set in advance in the semiconductor integrated circuit.

2. The fault simulator according to claim 1, wherein said fault position selection section selects, as the fault generation points, the circuit components specified in advance among the circuit components simulated in the simulation result information.

* * * * *